(12) United States Patent
Boutaghou et al.

(10) Patent No.: US 6,903,543 B2
(45) Date of Patent: Jun. 7, 2005

(54) DISC DRIVE SLIDER TEST SOCKET

(75) Inventors: Zine-Eddine Boutaghou, Vandais Heights, MN (US); Wayne A. Bonin, North Oaks, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 9 days.

(21) Appl. No.: 10/360,900

(22) Filed: Feb. 7, 2003

(65) Prior Publication Data

US 2004/0056650 A1 Mar. 25, 2004

Related U.S. Application Data

(60) Provisional application No. 60/412,249, filed on Sep. 20, 2002.

(51) Int. Cl.[7] .............................................. G01R 3/102
(52) U.S. Cl. ................... 324/158.1; 324/73.1
(58) Field of Search .............................. 324/755, 158.1, 324/754, 210, 212, 262; 360/128–129, 234.6, 245.8, 245.9, 137; 29/603.01, 603.03, 603.04

(56) References Cited

U.S. PATENT DOCUMENTS

| | | | |
|---|---|---|---|
| 5,706,080 A | * 1/1998 | Pekin et al. ................... | 356/72 |
| 5,758,406 A | 6/1998 | Hunsaker et al. ........ | 29/603.06 |
| 5,771,136 A | * 6/1998 | Girard ...................... | 360/245.7 |
| 5,838,517 A | * 11/1998 | Frater et al. ............. | 360/245.7 |
| 5,844,420 A | * 12/1998 | Weber et al. ................ | 324/757 |
| 5,877,920 A | * 3/1999 | Resh ....................... | 360/245.7 |
| 6,233,124 B1 | * 5/2001 | Budde et al. ............. | 360/294.4 |
| 6,237,215 B1 | 5/2001 | Hunsaker et al. ............. | 29/759 |
| 6,414,822 B1 | 7/2002 | Crane et al. ............. | 360/294.5 |
| 6,414,823 B1 | 7/2002 | Crane et al. ............. | 360/294.5 |
| 6,417,996 B1 | * 7/2002 | Budde ...................... | 360/245.7 |
| 6,459,260 B1 | * 10/2002 | Bonin et al. ............. | 324/158.1 |

* cited by examiner

Primary Examiner—Vinh P. Nguyen
(74) Attorney, Agent, or Firm—Kinney & Lange, P.A.

(57) ABSTRACT

A disc drive slider test system includes a support structure and a slider test socket carried by the support structure that releasably electrically and mechanically receives a slider for testing. The slider test socket includes a body forming a cavity for receiving the slider and a plurality of spring beams outside a plan area of the body connected to a clamp for releasably securing the slider in the cavity. In some exemplary embodiments, a microactuator is employed to position the slider secured by the slider test socket with high resolution with respect to tracks of the disc.

16 Claims, 5 Drawing Sheets

DISC DRIVE SLIDER TEST SOCKET

CROSS-REFERENCE TO RELATED APPLICATION(S)

This application claims the benefit of Provisional Application No. 60/412,249 filed Sep. 20, 2002 for "MAGMA-Ship: A Micro-Actuated Slider Test Socket" by Z. Boutaghou and W. Bonin.

INCORPORATION BY REFERENCE

The aforementioned Provisional Application No. 60/412,249 is hereby incorporated by reference in its entirety.

BACKGROUND OF THE INVENTION

The present invention relates to an assembly for testing a disc drive slider, and more particularly to a slider test socket of efficient construction to allow economical testing of sliders, even in high track density environments.

The processes employed for manufacturing transducing heads for disc drives are complex and susceptible to manufacturing errors. As a result, the yield of acceptable transducing heads is relatively low, and accurate testing is required to detect faulty heads. This testing requires a head to be carried over a rotating disc in the same general manner that would be employed in operation of a disc drive. Traditionally, this meant that an entire assembled disc drive (or at least the head suspension portion of the disc drive) would be tested, and discarded in its entirety or rebuilt if the head was defective. This procedure was wasteful and inefficient.

More recently, the concept of a "spin-stand" has been developed to allow a smaller portion of the disc drive to be tested in order to verify the operability of a transducing head. This allows a head gimbal assembly (HGA) to be mounted on the stand and tested separately from the remainder of the disc drive. However, even this design is wasteful, since the mechanical components of the HGA have to be scrapped when a faulty transducing head is detected.

In addition to the need for an efficient mechanism for testing transducing heads, the demands on the resolution of positioning the transducing head have increased as well, such that the conventional rotary motor actuation assemblies (e.g., a voice coil motor) may be unable to position the head with enough precision for operation or for effective testing. Rotary actuators also present problems in interconnecting hardware with successively tested parts, preventing optimal resonant performance. Microactuators have been proposed to perform the high resolution positioning of the head needed for operation of the disc drive, and may also be needed for effective testing as well.

An improved mechanism for testing transducing heads is needed in the art, and is the subject of the present invention.

BRIEF SUMMARY OF THE INVENTION

The present invention is a disc drive slider test system that includes a support structure and a slider test socket carried by the support structure that releasably electrically and mechanically receives a slider for testing. The slider test socket includes a body forming a cavity for receiving the slider and a plurality of spring beams outside a plan area of the body connected to a clamp for releasably securing the slider in the cavity. The plurality of spring beams may be attached to the body of the test socket in some exemplary embodiments, and composed of a metal, or in other exemplary embodiments may be integrally formed with the body from a MEMS-type material such as silicon. In further exemplary embodiments, a microactuator is employed to position the slider secured by the slider test socket with high resolution with respect to tracks of the disc.

DETAILED DESCRIPTION

Figure 1:
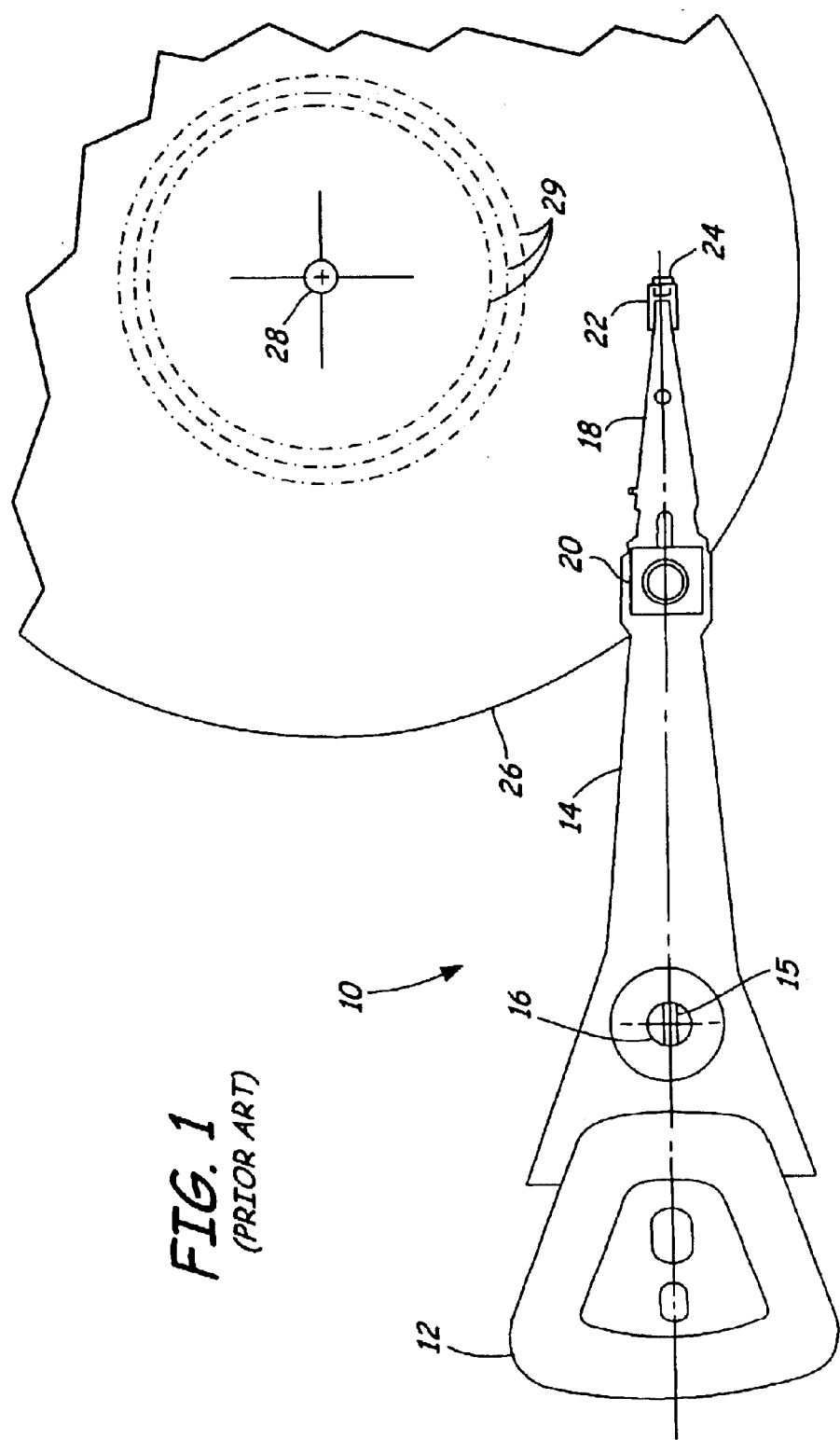
FIG. 1 is a diagram of an exemplary disc drive test system.

FIG. 1 is a diagram of exemplary disc drive test system 10. Test system 10 includes voice coil motor (VCM) 12 arranged to rotate actuator arm 14 around axis 15 on spindle 16. Head suspension 18 is connected to actuator arm 14 at head-mounting block 20. Gimbal 22 is connected to an end of head suspension 18, and carries slider 24. Slider 24 carries a transducing head (not shown in FIG. 1) for reading and/or writing data on concentric tracks of disc 26. Disc 26 rotates around axis 28, so that windage is encountered by slider 24 to keep it aloft a small distance above the surface of disc 27. VCM 12 is selectively operated to move actuator arm 14 around axis 15, thereby moving slider 24 with respect to tracks 29 of disc 27.

Figure 2:
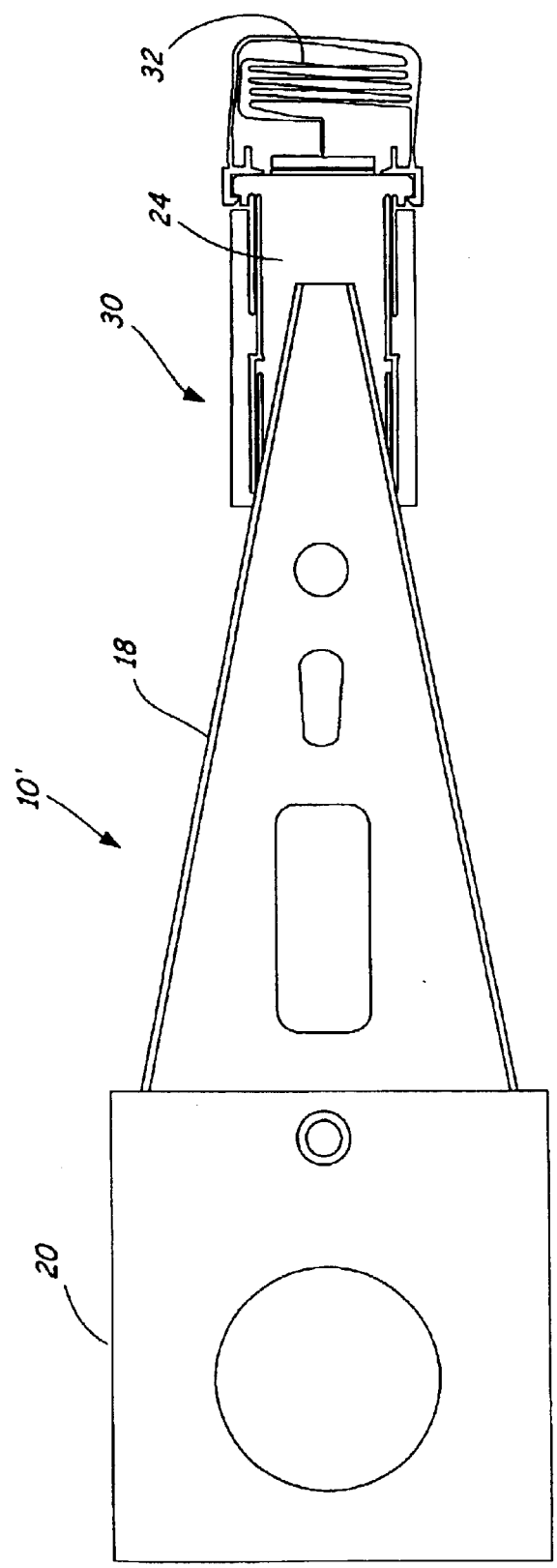
FIG. 2 is a diagram of a portion of a disc drive test system employing a slider test socket according to an embodiment of the present invention.

FIG. 2 is a diagram of a portion of disc drive test system 10' employing slider test socket 30 according to an embodiment of the present invention. Test socket 30 is attached to load beam 18 by a gimbal (not shown in FIG. 2 for ease of illustration), and clamps slider 24 into place with spring beams 32 for testing. The detailed construction of test socket 30 is discussed below.

Figure 3:
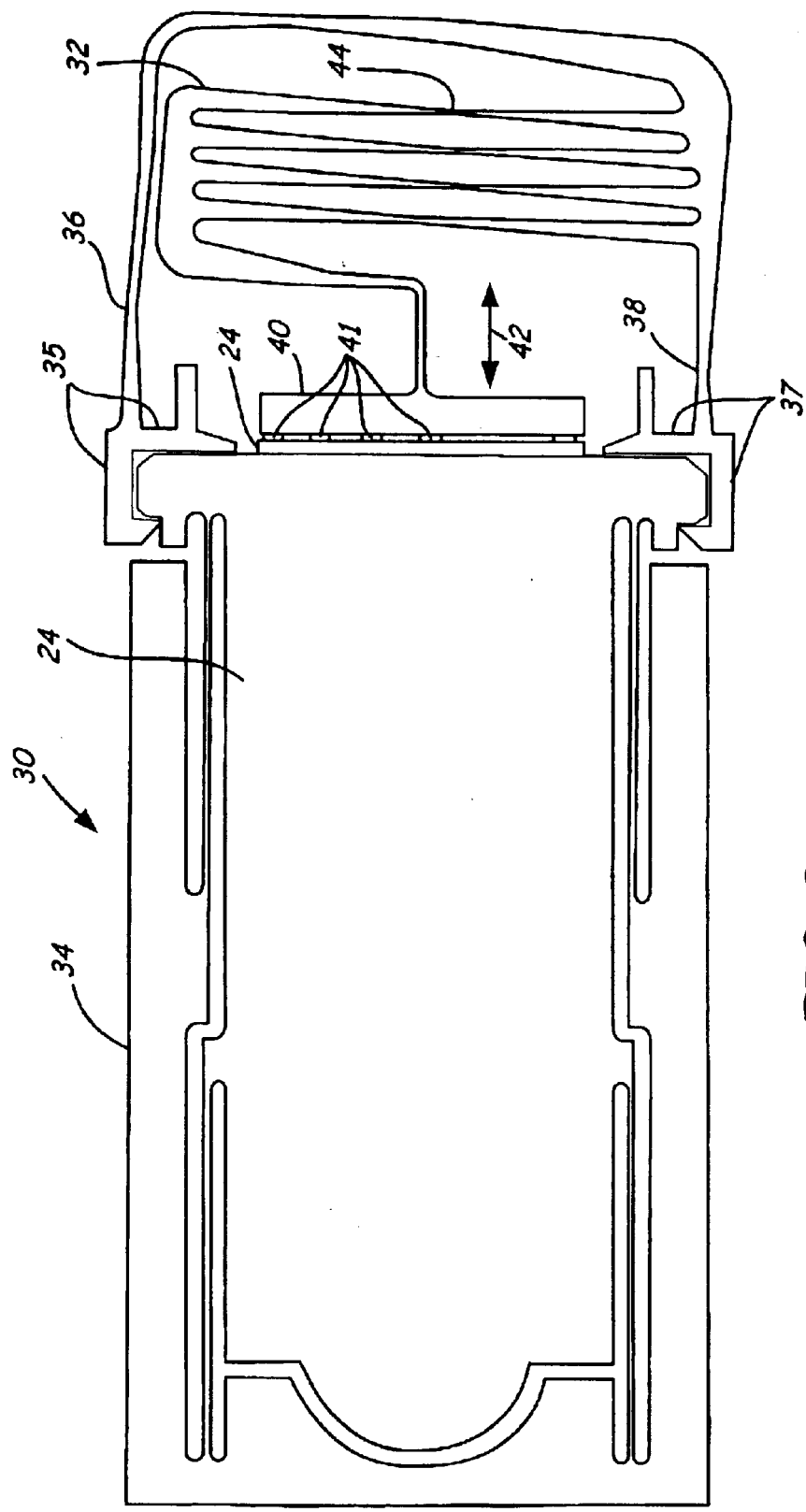
FIG. 3 is a diagram of a slider test socket according to an embodiment of the present invention.

FIG. 3 is a diagram of slider test socket 30 according to an embodiment of the present invention. Test socket 30 comprises a body portion 34 that is fabricated by a high resolution process such as a microelectromechanical system (MEMS) process, and is composed of a material such as silicon, for example. Body 34 forms a cavity for the insertion of slider 24. Test socket 30 also includes spring beams 32 attached to body 34 at attachment portion 35 by arm portion 36 and at attachment portion 37 by arm portion 38. In other embodiments, the attachment portions may be configured differently to adjust the area (and thus strength) of the attachment by adhesive. Spring beams 32 have sufficient resilience to allow clamp 40 to be pulled away from the cavity formed by body 34 for insertion of slider 24, and also provide sufficient clamping force to securely hold slider 24 in place. These characteristics are achieved due to the material and beam design of spring beams 32. The clamping mechanism makes electrical connection between contacts on slider 24 and contacts 41 on a polyimide flex circuit provided to make temporary connections to the slider contacts. The clamping mechanism alternatively may provide electrical connection between contacts on slider 24 and contacts located on body 34 of test socket 30.

Specifically, spring beams 32 have a design that allows clamp 40 to be moved in the direction of arrows 42 perpendicular to the trailing edge surface of slider 24, without creating stress on the beams that would cause them to be damaged. Arm portions 36 and 38 form an interior cavity where tapered cross beams 44 are located for connection to clamp 30. The entire arrangement of spring beams 32 is located outside of the plan area of body 34 and of slider 24. Spring beams 32 are then merely attached to body 34 at attachment portions 35 and 37 by arm portions 36 and 38. This is potentially advantageous because it allows conventional MEMS-based designs to be employed to construct body 34 of test socket 30 (such as a silicon suspension used for a slider-level microactuator, which is shown in the exemplary embodiment of FIG. 3), reducing the cost associated with implementation of the present invention.

In an exemplary embodiment, spring beams 32 are constructed of a metal material such as nickel cobalt (NiCo). Materials of this type are desirable because of their ability to withstand stresses caused by opening and closing clamp 40 without being damaged. For example, a design such as is shown in FIG. 3 constructed of NiCo is able to withstand stresses of 1.5 giga-Pascal (GPa) without damage, which allows for far more displacement of clamp 40 that is needed to insert slider 24.

In another exemplary embodiment, spring beams 32 may be constructed of silicon or a similar MEMS-type material, and may be integrated into the fabrication of body 34 so that test socket 30 is formed in a fully integrated process rather than requiring attachment of spring beams 32 to body 34. Such a construction reduces the stress that can withstood by spring beams 32 without damage. For the design shown in FIG. 3 to operate properly (that is, for clamp 40 to be displaced far enough to allow slider 24 to be inserted), spring beams 32 must be able to withstand about 1 GPa of stress. For a MEMS-type material to provide this property, the material must be fabricated with great care. For example, if silicon is used (currently the most popular MEMS material), it must have very few defects to achieve these characteristics. As MEMS fabrication technology improves, it is expected that the desired properties will be more readily achieved, so that test socket 30 can be economically and reliably manufactured with an integrated construction.

Figure 4:
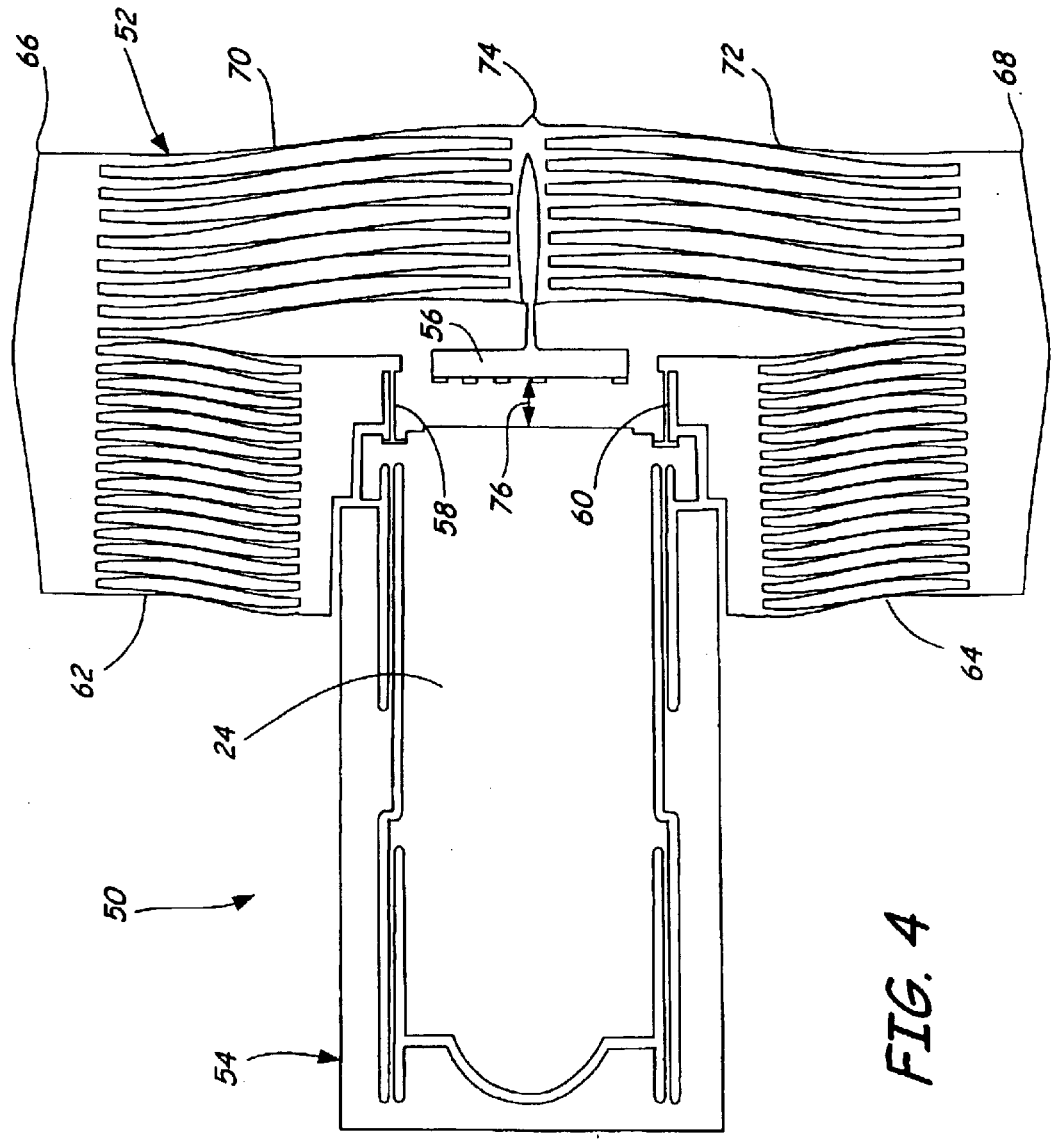
FIG. 4 is a diagram of a slider test socket according to an alternate embodiment of the present invention.

FIG. 4 is a diagram of slider test socket 50 according to an alternate embodiment of the present invention. Test socket includes spring beams 52 and body 54, and is designed so that spring beams 52 need only withstand stresses of up to about 0.5 GPa in order to achieve displacement of clamp 56 needed to insert slider 24 into the cavity formed by body 54. This configuration allows a MEMS-type material such as silicon to be readily used for spring beams 52, since the stress load is substantially lower than that of the embodiment shown in FIG. 3, such that test socket 50 can be formed in an integrated fashion by MEMS fabrication techniques. The design of FIG. 4 is best suited to low speed applications, since the increased plan area of spring beams 52 can potentially cause windage issues in high speed operation.

Specifically, spring beams 52 include arm portions 58 and 60 that extend from (or are attached to, in a non-integrated embodiment) body 54. Arm portion 58 extends to tapered cross beams 62, and arm portion 60 extends to tapered cross beams 64. Cross beams 62 are connected to wing 66, and cross beams 64 are connected to wing 68. Wing 66 is in turn connected to tapered cross beams 70, and wing 68 is connected to tapered cross beams 72, which meet at center body 74. Center body 74 is connected to clamp 56, and is movable by the resilience of cross beams 62, 64, 70 and 72 to allow for displacement of clamp 56 perpendicular to the trailing edge of slider 24 in the direction of arrows 76. As mentioned above, this design reduces the stresses on spring beams 52 so that they can be composed of a MEMS-type material and yet not be damaged by repeated opening and closing of clamp 56.

Figure 5:
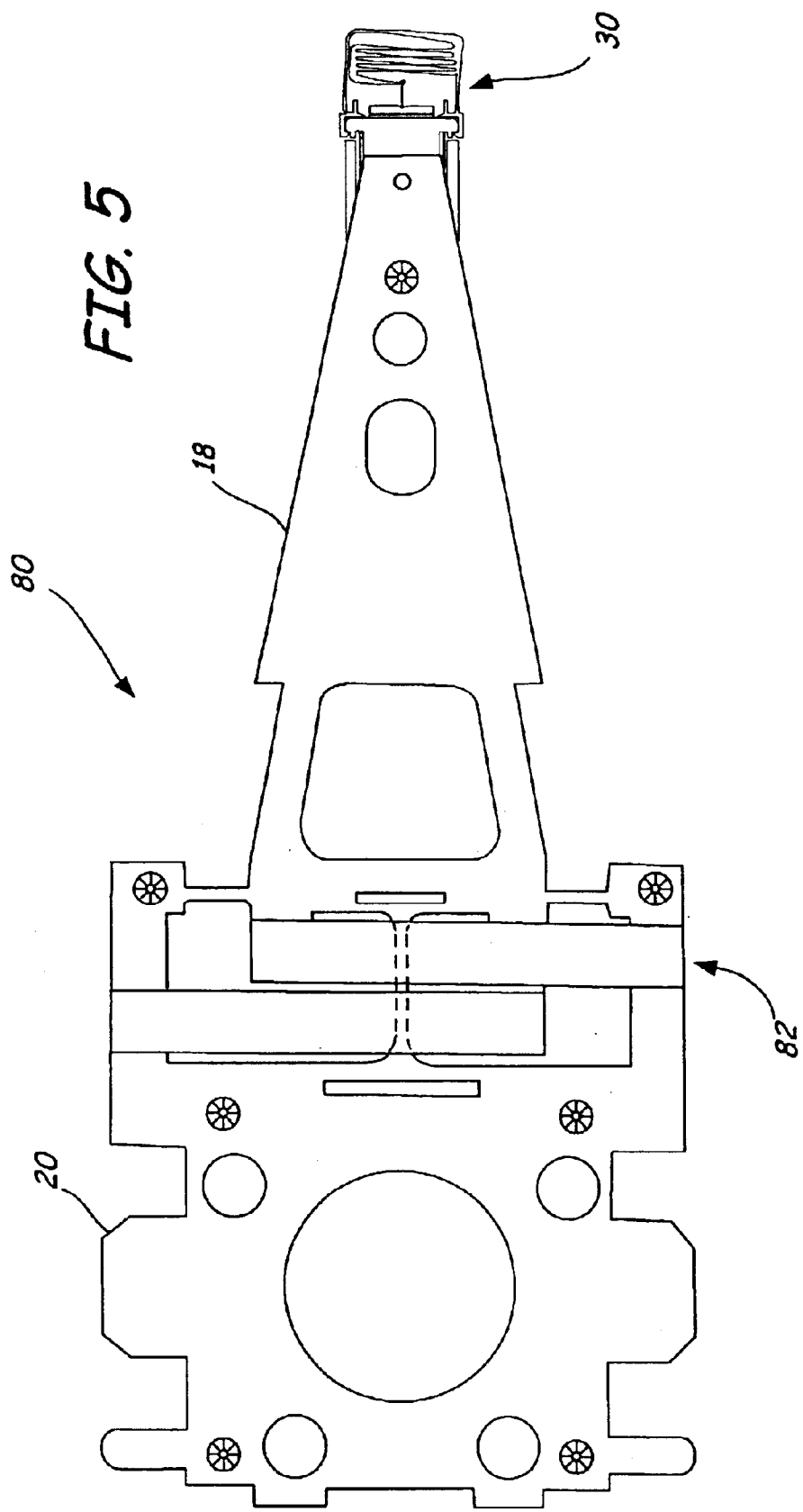
FIG. 5 is a diagram of a portion of a disc drive test system employing a suspension-level microactuator and a slider test socket according to an embodiment of the present invention.

An exemplary use of the test socket of the present invention is in a disc drive test system that employs a microactuator. The embodiments shown in FIGS. 2 and 3 employ a slider-level microactuator. FIG. 5 is a diagram of a portion of disc drive test system 80 employing suspension-level microactuator 82 and slider test socket 30 according to another embodiment of the present invention. Microactuator 82 is operable to move load beam 18 and test socket 30 with respect to mounting block 20, for positioning a slider with respect to the tracks of a disc. Test socket 30 is attached to load beam 18 by an appropriate gimbal (not shown for ease of illustration) and is carried over the surface of a disc to perform an electrical test of a transducing head carried by the slider received by test socket 30.

The present invention provides a slider test socket for performing electrical tests on a transducing head that readily receives and secures a slider. The test socket is carried over the surface of a disc by a support structure, and includes a body that forms a cavity for receiving the slider, and spring beams outside the plan area of the body for allowing a clamp to be displaced to receive the slider in the cavity and released to mechanically secure the slider in the test socket. By providing the spring beams outside of the plan area of the test socket body, conventional MEMS fabrication structures and techniques may be used for the body, reducing the total cost associated with the test socket. When the slider is secured in the test socket, electrical connections are also made so that appropriate testing may be performed. The spring beams may be composed of metal and attached to the body of the test socket, or in some embodiments may be composed of a MEMS-type material such as silicon and integrated into the overall design of the test socket. In some embodiments, a microactuator may also be employed that positions the test socket with high resolution over the tracks of the disc.

Although the present invention has been described with reference to preferred embodiments, workers skilled in the art will recognize that changes may be made in form and detail without departing from the spirit and scope of the invention.

What is claimed is:

1. A slider system, comprising:
   a support structure; and
   a slider socket carried by the support structure that releasably electrically and mechanically receives a slider, the slider socket comprising:
   a body forming a cavity for receiving the slider; and
   a plurality of spring beams outside a plan area of the body connected to a clamp for releasably securing the slider in the cavity.

2. The slider system of claim 1, wherein the plurality of spring beams are attached to the body of the slider socket.

3. The slider system of claim 2, wherein the plurality of spring beams are composed of a metal and the body of the slider socket is composed of a MEMS-type material.

4. The slider system of claim 3, wherein the plurality of spring beams are able to withstand a stress of 1.5 giga-Pascals (GPa) when displaced to allow insertion of the slider.

5. The slider system of claim 1, wherein the plurality of spring beams and the body of the slider socket are integrally formed of a MEMS-type material.

6. The slider system of claim 5, wherein the plurality of spring beams includes first, second, third and fourth tapered cross beams, a first wing connected to the first and third tapered cross beams, a second wing connected to the second and fourth tapered cross beams, and a center body connected between the third and fourth tapered cross beams that is connected to the clamp.

7. The slider system of claim 1, wherein the plurality of spring beams includes first and second arm portions connected by tapered cross beams which connect to the clamp.

8. The slider system of claim 1, wherein the slider socket includes a slider-level microactuator for positioning the slider received by the slider socket with respect to tracks of a rotatable disc.

9. The slider system of claim 1, wherein the support structure includes a suspension-level microactuator for positioning the slider received by the slider socket with respect to tracks of a rotatable disc.

10. A slider socket for releasably electrically and mechanically receiving a slider, comprising:

a body forming a cavity for receiving the slider; and a plurality of spring beams outside a plan area of the body connected to a clamp for releasably securing the slider in the cavity.

11. The slider socket of claim 10, wherein the plurality of spring beams are attached to the body of the slider socket.

12. The slider socket of claim 11, wherein the plurality of spring beams are composed of a metal and the body of the slider socket is composed of a MEMS-type material.

13. The slider socket of claim 12, wherein the plurality of spring beams are able to withstand a stress of 1.5 giga-Pascals (GPa) when displaced to allow insertion of the slider.

14. The slider socket of claim 10, wherein the plurality of spring beams and the body of the slider socket are integrally formed of a MEMS-type material.

15. The slider socket of claim 14, wherein the plurality of spring beams includes first, second, third and fourth tapered cross beams, a first wing connected to the first and third tapered cross beams, a second wing connected to the second and fourth tapered cross beams, and a center body connected between the third and fourth tapered cross beams that is connected to the clamp.

16. The slider socket of claim 10, wherein the plurality of spring beams includes first and second arm portions connected by tapered cross beams which connect to the clamp.

* * * * *